United States Patent
Lee

(10) Patent No.: US 9,467,109 B2
(45) Date of Patent: Oct. 11, 2016

(54) DIFFERENTIAL AMPLIFIER WITH HIGH-SPEED COMMON MODE FEEDBACK

(71) Applicant: Texas Instruments Incorporated, Dallas, TX (US)

(72) Inventor: Bumha Lee, Pleasanton, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 52 days.

(21) Appl. No.: 14/294,308

(22) Filed: Jun. 3, 2014

(65) Prior Publication Data

US 2015/0349734 A1    Dec. 3, 2015

(51) Int. Cl.
*H03F 3/45*    (2006.01)
*H03F 1/02*    (2006.01)

(52) U.S. Cl.
CPC ........ *H03F 3/45668* (2013.01); *H03F 1/0233* (2013.01); *H03F 3/4565* (2013.01); *H03F 3/45188* (2013.01); *H03F 3/45659* (2013.01); *H03F 2200/129* (2013.01); *H03F 2203/45008* (2013.01); *H03F 2203/45082* (2013.01); *H03F 2203/45084* (2013.01); *H03F 2203/45116* (2013.01); *H03F 2203/45404* (2013.01); *H03F 2203/45418* (2013.01); *H03F 2203/45424* (2013.01); *H03F 2203/45508* (2013.01)

(58) Field of Classification Search
CPC .......................................................... H03F 1/34
USPC .................................................. 330/252–261
See application file for complete search history.

(56) References Cited

U.S. PATENT DOCUMENTS 7,053,711 B2 * 5/2006 Bogner ................. H03F 3/4565
                                                                    330/253

* cited by examiner

*Primary Examiner* — Khanh V Nguyen
*Assistant Examiner* — Khiem Nguyen
(74) *Attorney, Agent, or Firm* — Andrew Viger; Frank D. Cimino

(57) ABSTRACT

The differential signals at the outputs of a differential amplifier quickly change in response to common mode changes in the output differential signals. The amplified input signals amplified by the differential amplifier quickly change in response to common mode changes in the differential signals input into the differential amplifier. A bias voltage input to the differential amplifier is isolated to remove low-frequency components from the bias voltage.

17 Claims, 1 Drawing Sheet

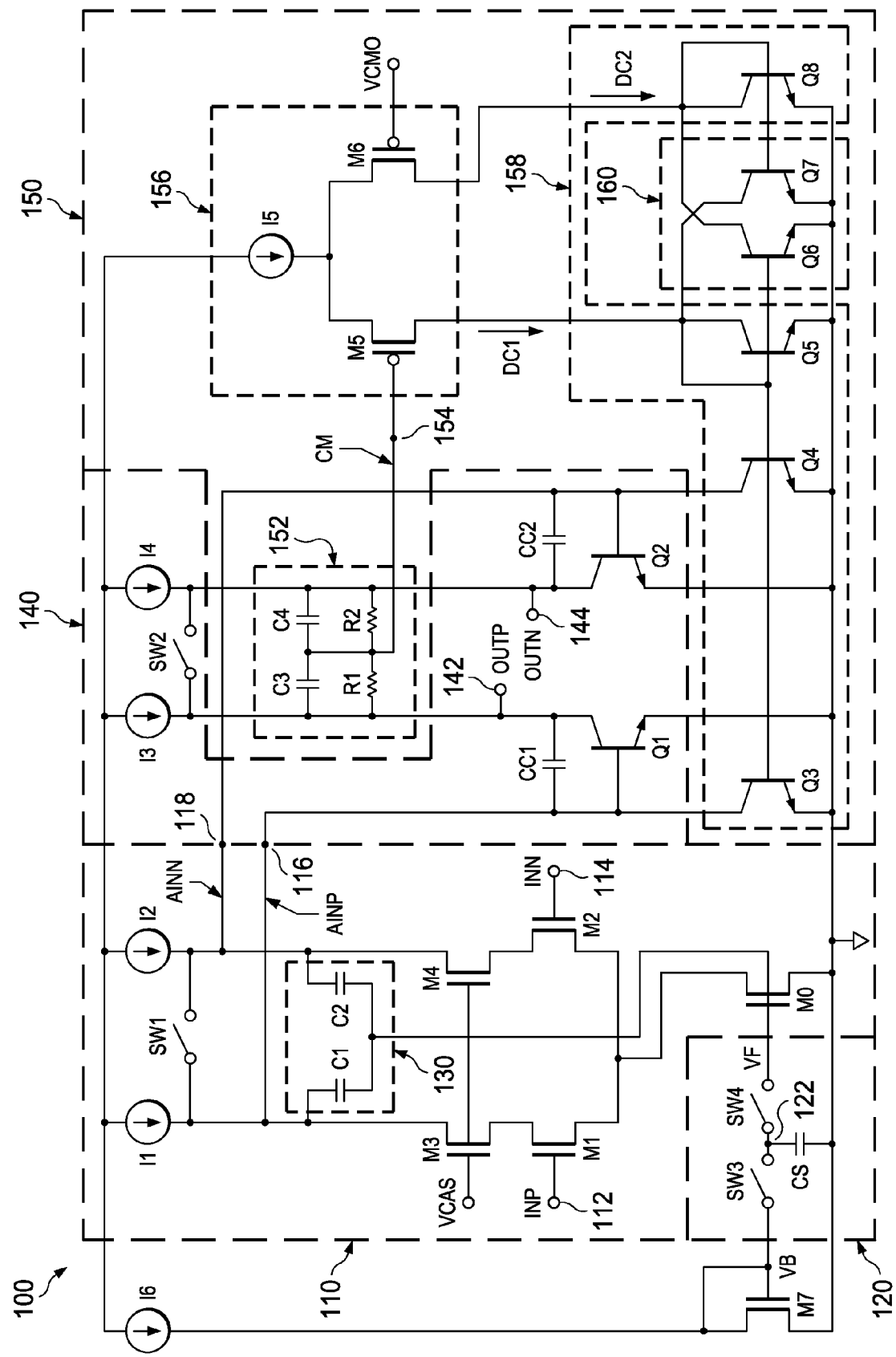

DIFFERENTIAL AMPLIFIER WITH HIGH-SPEED COMMON MODE FEEDBACK

BACKGROUND OF THE INVENTION

1. Field of the Invention

The present invention relates to differential amplifiers and, more particularly, to a differential amplifier with high-speed common mode feedback.

2. Description of the Related Art

A differential amplifier is a well-known circuit that amplifies a differential input signal. Differential amplifiers are used in many applications, and have a number of advantages, such as immunity to supply noise and two times higher dynamic range compared to a single-ended amplifier. In one application, a differential amplifier is used in a switched capacitor circuit.

One problem with amplifying the output of a switched capacitor circuit is that there are many switches opening and closing, and these opening and closing switches can cause strong and abrupt glitches in the output where, for example, a logic high signal drops momentarily to a logic low signal. The glitches introduce a common mode component into the signal output from the switched capacitor circuit which can substantially limit the capability of the differential amplifier. As a result, there is a need for a differential amplifier that can reduce the effect of glitches in the signals output from a switched capacitor circuit.

SUMMARY OF THE INVENTION

The present invention provides a differential amplifier that reduces the effect of a common mode fluctuation. A differential amplifier of the present invention includes a differential pair stage to receive a pair of input differential signals, and amplify the pair of input differential signals to form a pair of amplified differential signals at a pair of amplifier stage outputs. The differential amplifier also includes a driver stage to drive a pair of output differential signals in response to the pair of amplified differential signals. The driver stage is connected to the differential pair stage. Further, the differential amplifier includes a common mode feedback stage that is connected to the differential pair stage and the driver stage. The common mode feedback stage includes a RC sensing circuit to generate a measured common mode voltage in response to the pair of output differential signals. The common mode feedback stage also includes a diff-pair circuit to vary a first diff-pair current and a second diff-pair current in response to a difference between a magnitude of the measured common mode voltage and a magnitude of a reference common mode voltage. The diff-pair circuit is connected to the RC sensing circuit. In addition, the common mode feedback stage includes a control circuit to sink a first portion of the first diff-pair current, and vary the pair of output differential signals in response to a magnitude of the first portion of the first diff-pair current. The control circuit is connected to the driver stage and the diff-pair circuit. Further, the common mode feedback circuit includes a pull down circuit to sink a second portion of the first diff-pair current when the magnitudes of the measured common mode and reference common mode voltages are equal. The pull down circuit is to reduce the first portion of the first diff-pair current that is sunk by the control circuit and increase the second portion of the first diff-pair current that is sunk by the pull down circuit when the magnitude of the measured common mode voltage is greater than the magnitude of the reference common mode voltage. The pull down circuit is connected to the control circuit.

A differential amplifier of an alternate embodiment of the present invention includes a differential pair stage that has a first input transistor, a second input transistor, and a tail current transistor connected to the first and second input transistors. The first and second input transistors to receive a pair of input differential signals, and amplify the pair of input differential signals to form a pair of amplified differential signals at a pair of amplifier stage outputs. The differential amplifier also includes a common mode feedback circuit to pull up a voltage input to the tail current transistor in response to an increase in the amplified differential signals that results from a common mode component of the pair of input differential signals, and pull down the voltage input to the tail current transistor in response to a decrease in the amplified differential signals that results from the common mode component of the pair of input differential signals. The common mode feedback circuit is connected to the tail current transistor and the pair of amplifier stage outputs. The differential amplifier further includes a driver stage to drive a pair of output differential signals in response to the pair of amplified differential signals. The driver stage is connected to the differential pair stage. In addition, the differential amplifier includes a common mode feedback stage that is connected to the differential pair stage and the driver stage. The common mode feedback stage includes a RC sensing circuit to generate a measured common mode voltage in response to the pair of output differential signals. The common mode feedback stage also includes a diff-pair circuit to vary a first diff-pair current and a second diff-pair current in response to a difference between a magnitude of the measured common mode voltage and a magnitude of a reference common mode voltage. The diff-pair circuit is connected to the RC sensing circuit. In addition, the common mode feedback stage includes a control circuit to vary the pair of output differential signals in response to the magnitude of the first diff-pair current. The control circuit is connected to the driver stage and the diff-pair circuit.

The present invention also includes a method of operating a differential amplifier. The method includes receiving a pair of input differential signals, and amplifying the pair of input differential signals to form a pair of amplified differential signals at a pair of amplifier stage outputs. The method also includes driving a pair of output differential signals in response to the pair of amplified differential signals. Further, the method includes generating a measured common mode voltage in response to the pair of output differential signals, and varying a first diff-pair current and a second diff-pair current in response to a difference between a magnitude of the measured common mode voltage and a magnitude of a reference common mode voltage. In addition, the method includes sinking a first portion and a second portion of the first diff-pair current when the magnitudes of the measured common mode and reference common mode voltages are equal. The method also includes increasing the first portion and reducing the second portion of the first diff-pair current that is sunk when the magnitude of the measured common mode voltage is greater than the magnitude of the reference common mode voltage. The method further includes varying the pair of output differential signals in response to a magnitude of the first portion of the first diff-pair current.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWING

FIG. 1 is a schematic diagram illustrating an example of a differential amplifier 100 in accordance with the present invention.

DETAILED DESCRIPTION OF THE INVENTION

FIG. 1 shows a schematic diagram that illustrates an example of a differential amplifier 100 in accordance with the present invention. As described in greater detail below, differential amplifier 100 quickly changes the output differential signals in response to common mode components in the output differential signals, as well as quickly changes the amplified input differential signals in response to common mode components in the input differential signals. Further, differential amplifier 100 isolates an input bias voltage to remove low-frequency components from the input bias voltage.

As shown in FIG. 1, differential amplifier 100 includes a differential pair stage 110 that receives a pair of input differential signals INP and INN at a pair of differential inputs 112 and 114, and amplifies the pair of input differential signals INP and INN to form a pair of amplified differential signals AINP and AINN at a pair of amplifier stage outputs 116 and 118.

Differential pair stage 110 can be implemented in a number of ways. In the present example, differential pair stage 110 includes a pair of NMOS input transistors M1 and M2, a pair of NMOS stacked transistors M3 and M4, and a pair of current sources I1 and I2. Differential pair stage 110 also includes a NMOS tail current transistor M0 and a switch SW1.

MOS transistors include three terminals: a gate, a source, and a drain. The gate of NMOS input transistor M1 is connected to input 112, while the gate of NMOS input transistor M2 is connected to input 114. The sources of the NMOS input transistors M1 and M2 are connected together. The drain of NMOS input transistor M1 is connected to the source of NMOS stacked transistor M3, whose drain is connected to input current source I1 and amplifier stage output 116. Similarly, the drain of NMOS input transistor M2 is connected to the source of stacked NMOS transistor M4, whose drain is connected to input current source I2 and amplifier stage output 118.

The gates of the NMOS stacked transistors M3 and M4 are connected to a bias voltage VCAS that biases the NMOS stacked transistors M3 and M4. The bias voltage VCAS is about 300 millivolts higher than the average voltage of the input differential signals INP and INN. The NMOS stacked transistors M3 and M4, which are connected in a cascode manner, increase the gain and maintain a constant voltage on the drains of the NMOS input transistors M1 and M2.

NMOS tail current transistor M0 has a drain connected to the common source node of the pair of NMOS input transistors M1 and M2, a gate, and a source connected to ground. Further, switch SW1 is connected between the drains of the NMOS stacked transistors M3 and M4, which is also between the amplifier stage outputs 116 and 118.

In the present embodiment, differential amplifier 100 also includes an isolation circuit 120 that is connected to differential pair stage 110. Circuit 120 receives an input bias voltage VB, substantially removes any low-frequency components from the input bias voltage VB to form a constant bias voltage VF that is stable, and outputs the constant bias voltage VF to NMOS tail current transistor M0.

In the present example, isolation circuit 120 is implemented with a switch SW3, a switch SW4, and a bypass capacitor C5. Switch SW3 is connected between a bias voltage source and a node 122, while switch SW4 is connected between node 122 and the gate of NMOS tail current transistor M0. Bypass capacitor C5, in turn, is connected between node 122 and ground. Further in the present example, the bias voltage source is implemented with a NMOS diode-connected transistor M7 and a bias current source I6. NMOS diode-connected transistor M7 has an emitter connected to ground, and a gate and a drain connected to both bias current source I6 and switch SW3.

In the present embodiment, differential amplifier 100 additionally includes a common mode feedback circuit 130 that is connected to differential pair stage 110. Common mode feedback circuit 130 adjusts the pair of amplified differential signals AINP and AINN in response to a common mode component of the pair of differential signals INP and INN.

In the present example, common mode feedback circuit 130 is implemented with a capacitor C1 and a capacitor C2. Capacitor C1 has a first plate connected to the drain of NMOS stacked transistor M3 and amplifier stage output 116, and a second plate connected to the gate of NMOS tail current transistor M0. Similarly, capacitor C2 has a first plate connected to the drain of NMOS stacked transistor M4 and amplifier stage output 118, and a second plate connected to the gate of NMOS tail current transistor M0.

As further shown in FIG. 1, differential amplifier 100 includes a driver stage 140 that is connected to differential pair stage 110. Driver stage 140 drives a pair of output differential signals OUTP and OUTN from a pair of differential outputs 142 and 144 in response to the amplified differential signals AINP and AINN at the amplifier stage outputs 116 and 118.

Driver stage 140 can be implemented in a number of ways. In the present example, driver stage 140 includes a pair of output current sources I3 and I4 that are connected to the pair of differential outputs 142 and 144, respectively, a NPN bipolar transistor Q1 that controls the amount of I3 current that is sourced out of and sunk in from differential output 142, and a NPN bipolar transistor Q2 that controls the amount of I4 current that is sourced out of and sunk in from differential output 144.

Bipolar transistors have three terminals: a base, a collector, and an emitter. NPN bipolar transistor Q1 has a base connected to input current source I1 by way of amplifier stage output 116, a collector connected to the differential output 142, and an emitter connected to ground. NPN bipolar transistor Q2 has a base connected to input current source I2 by way of amplifier stage output 144, a collector connected to the differential output 144, and an emitter connected to ground.

Driver stage 140 also includes a first capacitor CC1 that is connected to amplifier stage output 116 and differential output 142, a second capacitor CC2 that is connected to amplifier stage output 118 and differential output 144, and a switch SW2 that is connected between the pair of differential outputs 142 and 144. The capacitors CC1 and CC2 are miller-compensation capacitors.

In the present embodiment, differential amplifier 100 further includes a common mode feedback stage 150 that is connected to differential pair stage 110 and driver stage 130. Common mode feedback stage 150 includes a RC sensing circuit 152 that generates a measured common mode voltage CM in response to the output differential signals OUTP and OUTN.

In the present example, RC sensing circuit 152 includes a sense output 154, a resistor R1 that is connected between differential output 142 and sense output 154, and a resistor R2 that is connected between differential output 144 and sense output 154. Resistors R1 and R2 are the same value. RC sensing circuit 152 further includes a capacitor C3 that is connected between differential output 142 and sense output 154, and a capacitor C4 that is connected between differential output 144 and sense output 154.

Common mode feedback stage 150 also includes a diff-pair circuit 156 that is connected to RC sensing circuit 152. Diff-pair circuit 156 varies the magnitude of a first diff-pair current DC1 and the magnitude of a second diff-pair current DC2 in response to a difference between the magnitude of the measured common mode voltage CM and the magnitude of a reference common mode voltage VCMO. The reference common mode voltage VCMO, which can be 0.8V when the supply voltage is 1.8V, must be high enough to ensure that the NPN bipolar transistors Q1 and Q2 remain in saturation mode, and low enough to prevent current source I6 from going into the linear region.

In the present example, diff-pair circuit 156 includes a pair of PMOS driver transistors M5 and M6, and a current source I5 that is connected to the common source node of the pair of PMOS driver transistors M5 and M6. The gate of PMOS driver transistor M5 is connected to sense output 154 to receive the measured common mode voltage CM, while the gate of PMOS driver transistor M6 is connected to receive the reference common mode voltage VCMO.

In addition, common mode feedback stage 150 includes a control circuit 158 that is connected to driver stage 140 and diff-pair circuit 156. Control circuit 158 varies the magnitudes of the output differential signals OUTP and OUTN in response to the magnitudes of the first and second diff-pair currents DC1 and DC2.

In the present example, control circuit 158 includes a pair of diode-connected NPN bipolar transistors Q5 and Q8, and a pair of control NPN bipolar transistors Q3 and Q4. The base and collector of the diode-connected NPN bipolar transistor Q5 are connected to the drain of PMOS transistor M5, while the emitter of NPN bipolar transistor Q5 is connected to ground. The base and collector of the diode-connected NPN bipolar transistor Q8 are connected to the drain of PMOS transistor M6, while the emitter of NPN bipolar transistor Q8 is connected to ground.

Control NPN bipolar transistor Q3 has a collector connected to amplifier stage output 116 and the base of NPN bipolar transistor Q1, and an emitter connected to ground. Control NPN bipolar transistor Q4 has a collector connected to amplifier stage output 118 and the base of NPN bipolar transistor Q2, and an emitter connected to ground. Both NPN bipolar transistors Q3 and Q4 have a base connected to the base and collector of diode-connected NPN bipolar transistor Q5.

The NPN bipolar transistors Q3 and Q4 have two noise sources. One of the noise sources is associated with the collector current, and the other noise source is associated with the base resistance. To minimize these noise sources, the bases of the NPN bipolar transistors Q3 and Q4 are large.

In the present embodiment, common mode feedback stage 150 also includes a pull down circuit 160 that is connected to control circuit 158. Pull down circuit 160 sinks a portion of the first diff-pair current DC1 when the magnitudes of the measured common mode voltage CM and reference common mode voltage VCMO are equal, and increases the portion of the first diff-pair current DC1 that is sunk when the magnitude of the measured common mode voltage CM is greater than the magnitude of the reference common mode voltage VCMO. Pull down circuit 160 also decreases the portion of the first diff-pair current DC1 that is sunk when the magnitude of the measured common mode voltage CM is less than the magnitude of the reference common mode voltage VCMO.

In addition, pull down circuit 160 sinks a portion of the second diff-pair current DC2 when the magnitudes of the measured common mode voltage CM and reference common mode voltage VCMO are equal, and increases the portion of the second diff-pair current DC2 that is sunk when the magnitude of the measured common mode voltage CM is less than the magnitude of the reference common mode voltage VCMO. Pull down circuit 160 decreases the portion of the second diff-pair current DC2 that is sunk when the magnitude of the measured common mode voltage CM is greater than the magnitude of the reference common mode voltage VCMO.

In the present example, pull down circuit 160 includes a pair of cross-coupled NPN bipolar transistors Q6 and Q7. Cross-coupled NPN bipolar transistor Q6 has a base connected to the base of diode-connected NPN bipolar transistor Q5, a collector connected to the drain of PMOS transistor M6, and an emitter connected to ground. Cross-coupled NPN bipolar transistor Q7 has a base connected to the base of diode-connected NPN bipolar transistor Q8, a collector connected to the drain of PMOS transistor M5, and an emitter connected to ground. The ratio of the cross-coupled NPN bipolar transistors Q6 and Q7 to the diode-connected NPN bipolar transistors Q5 and Q8 is determined by the stability of common mode feedback stage 150, with increased stability producing greater noise.

In operation, the switches SW1, SW2, and SW4 close while switch SW3 remains open. Closing the switches SW1 and SW2 resets differential amplifier 100. When switch SW3 opens and switch SW4 closes, the voltage on bypass capacitor C5 is placed on the gate of NMOS tail current transistor M0 as the constant bias voltage VF, turning on NMOS tail current transistor M0.

Following a reset period, the switches SW1, SW2, and SW4 open while switch SW3 closes. When switch SW3 closes, current from bias current source I6 charges up bypass capacitor C5 to place the input bias voltage VB on bypass capacitor C5 that is equal to the gate-to-source voltage of NMOS transistor M7, approximately 0.6V. One of the advantages of differential amplifier 100 is that by first placing the voltage on bypass capacitor C5 before the voltage is placed on the gate of NMOS tail current transistor M0, any low-frequency components of the voltage can be substantially removed.

Opening the switches SW1 and SW2 causes differential amplifier 100 to detect the voltages on the gates of the NMOS input transistors M1 and M2. The voltages on the gates of the NMOS input transistors M1 and M2 determine the magnitude of the I1 current that flows through the NMOS transistors M1 and M3, and the magnitude of the I2 current that flows through the NMOS transistors M2 and M4.

For example, when the voltages on the gates of the NMOS input transistors M1 and M2 are equal, a portion of the I1 current flows through the NMOS input transistors M1 and M3 into NMOS transistor M0, while an equivalent portion of the I2 current flows through the NMOS input transistors M2 and M4 into NMOS transistor M0.

However, when the voltage on the gate of NMOS input transistor M1 is greater than the voltage on the gate of NMOS input transistor M2, the portion of the I1 current that flows through the NMOS transistors M1 and M3 into NMOS transistor M0 increases while the portion of the I2 current that flows through the NMOS transistors M2 and M4 into NMOS transistor M0 decreases.

Similarly, when the voltage on the gate of NMOS input transistor M1 is less than the voltage on the gate of NMOS input transistor M2, the portion of the I1 current that flows through the NMOS transistors M1 and M3 into NMOS transistor M0 decreases, while the portion of the I2 current that flows through the NMOS transistors M2 and M4 into NMOS transistor M0 increases.

While a portion of the I1 current flows through the NMOS transistors M1 and M3, a remaining portion of the I1 current flows out amplifier stage output 116 to become the base current of NPN bipolar transistor Q1 and the collector current NPN bipolar transistor Q3. The magnitude of the collector current flowing into NPN bipolar transistor Q3 defines the magnitude of the base current that flows into NPN bipolar transistor Q1 which, in turn, defines the magnitude of the base voltage and the magnitudes of the collector current flowing into NPN bipolar transistor Q1 and the I3 current that flows out of differential output 142.

Similarly, while a portion of the I2 current flows through the NMOS transistors M2 and M4, a remaining portion of the I2 current flows out amplifier stage output 118 to become the base current of NPN bipolar transistor Q2 and the collector current NPN bipolar transistor Q4. The magnitude of the collector current flowing into NPN bipolar transistor Q4 defines the magnitude of the base current that flows into NPN bipolar transistor Q2 which, in turn, defines the magnitude of the base voltage and the magnitudes of the collector current flowing into NPN bipolar transistor Q2 and the I4 current that flows out of differential output 144.

Resistor R1 and resistor R2 of RC sensing circuit 152 function as a voltage divider that continuously generates the measured common mode voltage CM at sense output 154. The resistive voltage divider generates the reference common mode voltage CM to be equal to one-half of the sum of the voltages on the differential outputs 142 and 144 (a continuous average value). For example, if 1.0V is present on differential output 142 and 0.6V is present on differential output 144, then the measured common mode voltage CM is equal to (1.0V+0.6V)/2=0.8V. Capacitors C3 and C4 compensate for a pole formed by the resistors R1 and R2 and the gate capacitance of PMOS transistor M5, which would otherwise limit the high frequency operation of common mode feedback stage 150.

When the measured common mode voltage CM is equal to the reference common mode voltage VCMO, a portion of the current from current source I5 flows through and out of PMOS transistor M5 as the first diff-pair current DC1, while an equal portion of the I5 current flows through and out of PMOS transistor M6 as the second diff-pair current DC2.

The first diff-pair current DC1 flowing out of PMOS transistor M5 becomes the base currents for the NPN bipolar transistors Q3, Q4, and Q5 as well as the collector current for NPN bipolar transistor Q7. The second diff-pair current DC2 flowing out of PMOS transistor M6 becomes the base currents for the NPN bipolar transistors Q7 and Q8 as well as the collector current for NPN bipolar transistor Q6.

Substantially equal portions of the first diff-pair current DC1 flow into the bases of the NPN bipolar transistors Q3 and Q4 which, in turn, causes substantially equal portions of the I1 and I2 currents to flow into the collectors of the NPN bipolar transistors Q3 and Q4, respectively. As a result, substantially equal portions of the I1 and I2 currents are sunk by the NPN bipolar transistors Q3 and Q4. The remaining portion of the I1 current becomes the base current of NPN bipolar transistor Q1, while the remaining portion of the I2 current becomes the base current of NPN bipolar transistor Q2.

When the measured common mode voltage CM is less than the reference common mode voltage VCMO, the portion of the I5 current that flows through and out of PMOS transistor M5 as the first diff-pair current DC1 increases. At the same time, the portion of the I5 current that flows through and out of PMOS transistor M6 as the second diff-pair current DC2 decreases.

The increased magnitude of the first diff-pair current DC1 increases the magnitudes of the base currents flowing into the NPN bipolar transistors Q3 and Q4. The increased base currents increase the magnitudes of the collector currents flowing into the NPN bipolar transistors Q3 and Q4 which, in turn, reduces the magnitude of the I1 current that flows into the base of NPN bipolar transistor Q1 and the magnitude of the I2 current that flows into the base of NPN bipolar transistor Q2 by substantially equal amounts.

The reduced base currents flowing into NPN bipolar transistors Q1 and Q2 reduces the magnitudes of the base voltages and the magnitudes of the collector currents flowing into NPN bipolar transistors Q1 and Q2 by a substantially equal amount which, in turn, increases the magnitudes of the I3 and I4 currents that flow out of the differential outputs 142 and 144, respectively, by substantially equal amounts.

When the measured common mode voltage CM is greater than the reference common mode voltage VCMO, the portion of the I5 current that flows through and out of PMOS transistor M5 as the first diff-pair current DC1 decreases, while the portion of the I5 current that flows through and out of PMOS transistor M6 as the second diff-pair current DC2 increases.

The decreased magnitude of the first diff-pair current DC1 decreases the magnitudes of the base currents flowing into the NPN bipolar transistors Q3 and Q4. The decreased base currents decrease the magnitudes of the collector currents flowing into the NPN bipolar transistors Q3 and Q4 which, in turn, increases the magnitude of the I1 current that flows into the base of NPN bipolar transistor Q1 and the magnitude of the I2 current that flows into the base of NPN bipolar transistor Q2 by substantially equal amounts.

The increased base currents flowing into NPN bipolar transistors Q1 and Q2 increases the magnitude of the base voltages and the magnitudes of the collector currents flowing into NPN bipolar transistors Q1 and Q2 by a substantially equal amount which, in turn, decreases the magnitudes of the I3 and I4 currents that flow out of the differential outputs 142 and 144, respectively, by substantially equal amounts.

Thus, common mode feedback stage 150 provides a continuous common mode feedback loop. In addition, common mode feedback stage 150 has a very high frequency pole at the base of diode-connected NPN bipolar transistor Q5. The frequency of this pole should be much higher than the frequency of the next lowest pole for better common mode loop stability.

One of the advantages of differential amplifier 100 is that the cross-coupled NPN bipolar transistors Q6 and Q7 of pull down circuit 160 allow differential amplifier 100 to respond quickly to changes in the measured common mode voltage CM, thereby providing a differential amplifier with a fast common mode settling time.

When the measured common mode voltage CM quickly falls below the reference common mode voltage VCMO in response to a common mode source, PMOS transistor M5 passes more of the I5 current as the first diff-pair current DC1, while PMOS transistor M6 passes less of the I5 current as the second diff-pair current DC2.

For example, when the voltage of the differential signal OUTP at differential output 142 falls from 1.0V to 0.8V, and the voltage of the differential signal OUTN at differential output 144 falls from 0.6V to 0.4V, the measured common mode voltage CM falls from 0.8V to 0.6V. When the reference common mode voltage VCMO is set to 0.8V, the fall in the measured common mode voltage CM causes PMOS transistor M5 to increase the magnitude of the first diff-pair current DC1 and PMOS transistor M6 to decrease the magnitude of the second diff-pair current DC2.

The increase in the magnitude of the first diff-pair current DC1 increases the base current flowing into cross-coupled NPN bipolar transistor Q6 which, in turn, causes cross-coupled NPN bipolar transistor Q6 to sink more of the second diff-pair current DC2. The magnitude of the second diff-pair current DC2 falls quickly due to less DC2 current flowing out of PMOS transistor M6 and more DC2 current flowing into cross-coupled NPN bipolar transistor Q6.

As a result, less of the second diff-pair current DC2 flows into the base of cross-coupled NPN bipolar transistor Q7, and less of the first diff-pair current DC1 flows into the collector of cross-coupled NPN bipolar transistor Q7. Thus, the magnitude of the first diff-pair current DC1 rises quickly due to more DC1 current flowing out of PMOS transistor M5 and less DC1 current flowing into cross-coupled NPN bipolar transistor Q7.

Therefore, the NPN bipolar transistors Q3 and Q4 quickly receive more base current. The increased base currents increase the magnitudes of the collector currents flowing into the NPN bipolar transistors Q3 and Q4 which, in turn, decreases the magnitude of the I1 current that flows into the base of NPN bipolar transistor Q1 and the magnitude of the I2 current that flows into the base of NPN bipolar transistor Q2 by substantially equal amounts.

The decreased base currents flowing into the NPN bipolar transistors Q1 and Q2 decreases the base voltages and the magnitudes of the collector currents flowing into NPN bipolar transistors Q1 and Q2 by a substantially equal amount which, in turn, increases the magnitudes of the I3 and I4 currents that flow out of the differential outputs 142 and 144, respectively, by substantially equal amounts.

Thus, in the above example, when the voltage of the differential signal OUTP at differential output 142 falls from 1.0V to 0.8V, and the voltage of the differential signal OUTN at differential output 144 falls from 0.6V to 0.4V, cross-coupled NPN bipolar transistor Q6 quickly pulls down the magnitude of the second diff-pair current DC2.

Quickly pulling down the magnitude of the second diff-pair current DC2 quickly increases the magnitude of the first diff-pair current DC1 which increases the I3 and I4 currents to be output from the differential outputs 142 and 144 which, in turn, pulls the magnitude of the 0.8V differential signal OUTP up towards 1.0V and the magnitude of the 0.4V differential signal OUTN up towards 0.6V.

Thus, pull down circuit 160 and the action of the cross-coupled NPN bipolar transistors Q6 and Q7 provide a large common mode current drive by substantially increasing the magnitude of the first diff-pair current DC1 that allows common mode feedback stage 150 to quickly restore the magnitudes of the output differential signals OUTP and OUTN, thereby minimizing the effect of common mode components in the output differential signals OUTP and OUTN. In addition, the action of the cross-coupled NPN bipolar transistors Q6 and Q7 last only as long as needed to respond to the common mode component.

Conversely, when the measured common mode voltage CM quickly rises above the reference common mode voltage VCMO in response to a common mode source, PMOS transistor M5 passes less of the I5 current as the first diff-pair current DC1, while PMOS transistor M6 passes more of the I5 current as the second diff-pair current DC2.

For example, when the voltage of the differential signal OUTP at differential output 142 jumps from 1.0V to 1.2V, and the voltage of the differential signal OUTN at differential output 144 jumps from 0.6V to 0.8V, the measured common mode voltage CM jumps from 0.8V to 1.0V. When the reference common mode voltage VCMO is set to 0.8V, the jump in the measured common mode voltage CM causes PMOS transistor M5 to reduce the magnitude of the first diff-pair current DC1, and PMOS transistor M6 to increase the magnitude of the second diff-pair current DC2.

The increase in the magnitude of the second diff-pair current DC2 increases the base current flowing into cross-coupled NPN bipolar transistor Q7 which, in turn, causes cross-coupled NPN bipolar transistor Q7 to sink more of the first diff-pair current DC1. Thus, the magnitude of the first diff-pair current DC1 falls quickly due to less DC1 current flowing out of PMOS transistor M5 and more DC1 current flowing into cross-coupled NPN bipolar transistor Q7.

As a result, the NPN bipolar transistors Q3 and Q4 quickly receive less base current. The decreased base currents decrease the magnitudes of the collector currents flowing into the NPN bipolar transistors Q3 and Q4 which, in turn, increases the magnitude of the I1 current that flows into the base of NPN bipolar transistor Q1 and the magnitude of the I2 current that flows into the base of NPN bipolar transistor Q2 by substantially equal amounts.

The increased base currents flowing into the NPN bipolar transistors Q1 and Q2 increases the base voltages and the magnitudes of the collector currents flowing into NPN bipolar transistors Q1 and Q2 by a substantially equal amount which, in turn, decreases the magnitudes of the I3 and I4 currents that flow out of the differential outputs 142 and 144, respectively, by substantially equal amounts.

Thus, in the above example, when the voltage of the differential signal OUTP at differential output 142 jumps from 1.0V to 1.2V, and the voltage of the differential signal OUTN at differential output 144 jumps from 0.6V to 0.8V, cross-coupled NPN bipolar transistor Q7 quickly pulls down the magnitude of the first diff-pair current DC1 which causes less current to be output from the differential outputs 142 and 144 which, in turn, pulls the magnitude of the 1.2V differential signal OUTP back towards 1.0V and the magnitude of the 0.8V differential signal OUTN back towards 0.6V.

Thus, pull down circuit 160 and the action of the cross-coupled NPN bipolar transistors Q6 and Q7 allow common mode feedback stage 150 to quickly restore the magnitudes of the output differential signals OUTP and OUTN, thereby minimizing the effect of common mode components in the output differential signals OUTP and OUTN. In addition, the action of the cross-coupled NPN bipolar transistors Q6 and Q7, which substantially decreases the magnitude of the first diff-pair current DC1, lasts only as long as needed to respond to the common mode component.

Another advantage of the present invention is that common mode feedback circuit 130 substantially reduces the effect of a glitch on the input differential signals INP and INN at the differential inputs 112 and 114. When the voltages on the differential inputs 112 and 114 quickly fall due to a glitch, the voltage of the amplified signal AINP on the drain of the NMOS stacked transistor M3 and the top plate of capacitor C1, and the voltage of the amplified signal AINN on the drain of the NMOS stacked transistor M4 and the top plate of capacitor C2, follow and quickly fall.

When the voltages on the top plates of the capacitors C1 and C2 fall, the voltage on the bottom plates the capacitors C1 and C2 also falls which causes the gate voltage on NMOS tail current transistor M0 to fall. The falling gate voltage on NMOS tail current transistor M0 increases the gate-to-source voltages of the NMOS input transistors M1 and M2.

Increasing the gate-to-source voltages of the NMOS input transistors M1 and M2 increases the current that flows through the NMOS input transistors M1 and M2 which, in turn, increases the magnitudes of the amplified signals AINP AINN. Thus, common mode feedback circuit 130 quickly restores the magnitudes of the amplified signals AINP AINN, thereby minimizing the effect of a glitch on the input differential signals INP and INN.

Conversely, when the voltages on the differential inputs 112 and 114 quickly jump due to the glitch, the voltage of the amplified signal AINP on the drain of the NMOS stacked transistor M3 and the top plate of capacitor C1, and the voltage of the amplified signal AINN on the drain of the NMOS stacked transistor M4 and the top plate of capacitor C2, follow and quickly jump.

When the voltages on the top plates of the capacitors C1 and C2 jump, the voltage on the bottom plates the capacitors C1 and C2 also jump which causes the gate voltage on NMOS tail current transistor M0 to rise. The rising gate voltage on NMOS tail current transistor M0 increases the gate-to-source voltages of the NMOS input transistors M1 and M2. Increasing the gate-to-source voltages of the NMOS input transistors M1 and M2 increases the current that flows through the NMOS input transistors M1 and M2 which, in turn, increases the magnitudes of the amplified differential signals AINP and AINN. Thus, common mode feedback circuit 130 again quickly restores the magnitudes of the amplified signals AINP AINN, thereby minimizing the effect of a glitch on the input differential signals INP and INN.

Although differential amplifier 100 has been described as including isolation circuit 120, common mode feedback circuit 130, and pull down circuit 160, a differential amplifier in accordance with the present invention can include any combination of these three circuits 120, 130, and 160.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A differential amplifier comprising:
    a differential pair stage to receive a pair of input differential signals, and amplify the pair of input differential signals to form a pair of amplified differential signals at a pair of amplifier stage outputs;
    a driver stage connected to the differential pair stage, the driver stage to drive a pair of output differential signals in response to the pair of amplified differential signals; and
    a common mode feedback stage connected to the differential pair stage and the driver stage, the common mode feedback stage including:
        a RC sensing circuit to generate a measured common mode voltage in response to the pair of output differential signals;
        a diff-pair circuit connected to the RC sensing circuit, the diff-pair circuit to oppositely vary a first diff-pair current and a second diff-pair current in response to a difference between a magnitude of the measured common mode voltage and a magnitude of a reference common mode voltage;
        a control circuit connected to the driver stage and the diff-pair circuit, the control circuit to vary the pair of output differential signals in response to a magnitude of a first portion of the first diff-pair current; and
        a pull down circuit connected to the control circuit, the pull down circuit including first and second cross-coupled pull down transistors
        the first pull down transistor having a control terminal connected to receive a portion of the first diff-pair current, and connected to sink a controlled second portion of the second diff-pair current; and
        the second pull down transistor having a control terminal connected to receive the second diff-pair current, and connected to sink a controlled second portion of the first diff-pair current,
        when the magnitude of the measured common mode voltage is greater than the magnitude of the reference common mode voltage, the pull down circuit to increase the controlled second portion of the first diff-pair current sunk by the second pull-down transistor, thereby decreasing the magnitude of the first portion of the first diff-pair current,
        when the magnitude of the measured common mode voltage is less than the magnitude of the reference common mode voltage, the pull down circuit to increase the controlled second portion of the second diff-pair current sunk by the first pull-down transistor, thereby decreasing the controlled second portion of the first diff-pair current sunk by the second pull-down transistor, and thereby increasing the magnitude of the first portion of the first diff-pair current.

2. The differential amplifier of claim 1 wherein the first terminal of the first pull down transistor is a base of a first bipolar transistor, and the second terminal of the first pull down transistor is a collector of the first bipolar transistor.

3. The differential amplifier of claim 2 wherein the first terminal of the second pull down transistor is a base of a second bipolar transistor, and the second terminal of the second pull down transistor is a collector of the second bipolar transistor.

4. The differential amplifier of claim 1 wherein the differential pair stage includes a first input transistor, a second input transistor, and a tail current transistor connected to the first and second input transistors, the first and second input transistors to receive the pair of input differential signals.

5. The differential amplifier of claim 4 and further comprising a common mode feedback circuit connected to the tail current transistor and the pair of amplifier stage outputs, the common mode feedback circuit to pull up a voltage input to the tail current transistor in response to an increase in the amplified differential signals that results from a common mode component of the pair of input differential signals, and pull down the voltage input to the tail current transistor in response to a decrease in the amplified differential signals that results from the common mode component of the pair of input differential signals.

6. The differential amplifier of claim 5 wherein:
the tail current transistor has a gate, a source, and a drain; and
the common mode feedback circuit includes:
a first capacitor with a top plate connected to a first amplifier stage output of the pair of amplifier stage outputs, and a bottom plate connected to the gate of the tail current transistor; and
a second capacitor with a top plate connected to a second amplifier stage output of the pair of amplifier stage outputs, and a bottom plate connected to the gate of the tail current transistor.

7. The differential amplifier of claim 6 and further comprising an isolation circuit connected to the differential pair stage, the isolation circuit to receive an input bias voltage, substantially remove a low-frequency component from the input bias voltage to form a constant bias voltage, and output the constant bias voltage to the differential pair stage.

8. The differential amplifier of claim 7 wherein the isolation circuit includes:
a first switch connected to the gate of the tail current transistor;
a second switch connected to the first switch; and
a bypass capacitor connected to the first and second switches.

9. A differential amplifier comprising:
a differential pair stage having a first input transistor, a second input transistor, and a tail current transistor connected to the first and second input transistors, the first and second input transistors to receive a pair of input differential signals, and amplify the pair of input differential signals to form a pair of amplified differential signals at a pair of amplifier stage outputs;
a common mode feedback circuit connected to the tail current transistor and the pair of amplifier stage outputs, the common mode feedback circuit to pull up a voltage input to the tail current transistor in response to an increase in the amplified differential signals that results from a common mode component of the pair of input differential signals, and pull down the voltage input to the tail current transistor in response to a decrease in the amplified differential signals that results from the common mode component of the pair of input differential signals;
a driver stage connected to the differential pair stage, the driver stage to drive a pair of output differential signals in response to the pair of amplified differential signals; and
a common mode feedback stage connected to the differential pair stage and the driver stage, the common mode feedback stage includes:
a RC sensing circuit to generate a measured common mode voltage in response to the pair of output differential signals;
a diff-pair circuit connected to the RC sensing circuit, the diff-pair circuit to vary a first diff-pair current and a second diff-pair current in response to a difference between a magnitude of the measured common mode voltage and a magnitude of a reference common mode voltage; and
a control circuit connected to the driver stage and the diff-pair circuit, the control circuit to vary the pair of output differential signals in response to a magnitude of the first diff-pair current; and
a pull down circuit connected to the control circuit, the pull down circuit including first and second cross-coupled pull down transistors
the first pull down transistor having a control terminal connected to receive a portion of the first diff-pair current, and connected to sink a controlled second portion of the second diff-pair current; and
the second pull down transistor having a control terminal connected to receive the second diff-pair current, and connected to sink a controlled second portion of the first diff-pair current,
when the magnitude of the measured common mode voltage is greater than the magnitude of the reference common mode voltage, the pull down circuit to increase the controlled second portion of the first diff-pair current sunk by the second pull-down transistor, thereby decreasing the magnitude of the first portion of the first diff-pair current,
when the magnitude of the measured common mode voltage is less than the magnitude of the reference common mode voltage, the pull down circuit to increase the controlled second portion of the second diff-pair current sunk by the first pull-down transistor, thereby decreasing the controlled second portion of the first diff-pair current sunk by the second pull-down transistor, and thereby increasing the magnitude of the first portion of the first diff-pair current.

10. The differential amplifier of claim 9 wherein:
the tail current transistor has a gate, a source, and a drain; and
the common mode feedback circuit includes:
a first capacitor with a top plate connected to a first amplifier stage output of the pair of amplifier stage outputs, and a bottom plate connected to the gate of the tail current transistor; and
a second capacitor with a top plate connected to a second amplifier stage output of the pair of amplifier stage outputs, and a bottom plate connected to the gate of the tail current transistor.

11. The differential amplifier of claim 10 and further comprising an isolation circuit connected to the differential pair stage, the isolation circuit to receive an input bias voltage, substantially remove a low-frequency component from the input bias voltage to form a constant bias voltage, and output the constant bias voltage to the differential pair stage.

12. The differential amplifier of claim 11 wherein the isolation circuit includes:
a first switch connected to the gate of the tail current transistor;
a second switch connected to the first switch; and
a bypass capacitor connected to the first and second switches.

13. A method of operating a differential amplifier comprising:

receiving a pair of input differential signals, and amplifying the pair of input differential signals to form a pair of amplified differential signals at a pair of amplifier stage outputs;

driving a pair of output differential signals in response to the pair of amplified differential signals;

generating a measured common mode voltage in response to the pair of output differential signals;

varying a first diff-pair current and a second diff-pair current in response to a difference between a magnitude of the measured common mode voltage and a magnitude of a reference common mode voltage;

sinking a first portion and a second portion of the first diff-pair current when the magnitudes of the measured common mode and reference common mode voltages are equal;

increasing the first portion and reducing the second portion of the first diff-pair current that is sunk when the magnitude of the measured common mode voltage is greater than the magnitude of the reference common mode voltage;

decreasing the first portion and increasing the second portion of the first diff-pair current that is sunk when the magnitude of the measured common mode voltage is less than the magnitude of the reference common mode voltage; and varying the pair of output differential signals in response to a magnitude of the first portion of the first diff-pair current.

14. The method of claim 13 and further comprising pulling up a voltage input to a tail current transistor in response to an increase in the amplified differential signals that results from a common mode component of the pair of input differential signals.

15. The method of claim 14 and further comprising pulling down the voltage input to the tail current transistor in response to a decrease in the amplified differential signals that results from a common mode component of the pair of input differential signals.

16. The method of claim 15 and further comprising receiving an input bias voltage, substantially removing a low-frequency component from the input bias voltage to form a constant bias voltage, and outputting the constant bias voltage to the tail current transistor.

17. The method of claim 14 wherein the tail current transistor is connected to a first input transistor that receives a first input differential signal of the pair of input differential signals, and a second input transistor that receives a second input differential signal of the pair of input differential signals.

* * * * *